United States Patent
Goetz et al.

(10) Patent No.: US 6,441,393 B2
(45) Date of Patent: *Aug. 27, 2002

(54) SEMICONDUCTOR DEVICES WITH SELECTIVELY DOPED III-V NITRIDE LAYERS

(75) Inventors: Werner Goetz, Palo Alto; R. Scott Kern, San Jose, both of CA (US)

(73) Assignee: LumiLeds Lighting U.S., LLC, San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/442,590

(22) Filed: Nov. 17, 1999

(51) Int. Cl.[7] .................... H01L 29/76; H01L 27/15; H01L 33/00
(52) U.S. Cl. .................. 257/13; 257/79; 257/83; 257/87; 257/94
(58) Field of Search .................. 257/79, 80, 88, 257/83, 94, 103, 87, 615; 438/925; 148/DIG. 110, 31

(56) References Cited

U.S. PATENT DOCUMENTS

| | | | | |
|---|---|---|---|---|
| 5,116,455 A | * | 5/1992 | Daly | 156/605 |
| 5,825,052 A | | 10/1998 | Shakuda | 257/94 |
| 5,844,303 A | * | 12/1998 | Kikkawa et al. | 257/609 |
| 6,121,639 A | * | 9/2000 | Van de Walle | 257/103 |

FOREIGN PATENT DOCUMENTS

| | | | | |
|---|---|---|---|---|
| EP | 0 497 350 | | 8/1992 | C30B/25/02 |
| EP | 559455 | * | 8/1993 | 257/79 |
| EP | 541373 | * | 12/1993 | 257/79 |
| JP | 8-167735 | * | 6/1996 | |

OTHER PUBLICATIONS

K.Hiruma et al., "improved perfomance . . . Epitaxy", IEEE Transactions On Electron Devices vol. 36, No. 2 Feb. 1989.*

Drizhuk, A. et al.: "Multicolor gallium nitride light–emitting diodes with high luminescence yield" Technical Physics Letters, 1996, vol. 22, pp. 533–534, XP000625297, ISSN: 1063–7850.

Kern, R. et al.: "Role of Growth Initiation for High–Brightness GaN–Based Light Emitting Diodes" Blue Laser and LEDs, Chiba, 1998, pp. 433–436, XP000998158, ISBN: 4–274–90245–5.

Kim, K. S. et al.: "The study on the growth and properties of Mg doped and Mg–Si codoped p–type GaN" Solid–State Electronics, Sep. 1999, vol. 43, No. 9, pp. 1807–1812, XP002165928, ISSN: 0038–1101.

(List continued on next page.)

*Primary Examiner*—Jerome Jackson, Jr.
*Assistant Examiner*—Shrinivas H. Rao
(74) *Attorney, Agent, or Firm*—Skjerven Morrill LLP; Norman R. Klivans, Jr.; Gergely T. Zimanyi

(57) ABSTRACT

A semiconductor device is provided having n-type device layers of III–V nitride having donor dopants such as germanium (Ge), silicon (Si), tin (Sn), and/or oxygen (O) and/or p-type device layers of III–V nitride having acceptor dopants such as magnesium (Mg), beryllium (Be), zinc (Zn), and/or cadmium (Cd), either simultaneously or in a doping superlattice, to engineer strain, improve conductivity, and provide longer wavelength light emission.

13 Claims, 2 Drawing Sheets

OTHER PUBLICATIONS

Ploog, K. et al.: "Doping of group III nitrides" J. of Vacuum Science & Technol. A, 1998, vol. 16, No. 3, pp. 1609–1614, XP002165927, ISSN: 0734–2101.

Romano, L. et al.: "Effect of Si doping on the strain and defect structure of GaN thin films" Defects in Semiconductors, Berkeley, Jul. 1999, vol. 273–274, pp. 50–53, XP000998264, Physica B, Dec. 1999, ISSN: 0921–4526.

Yamamoto, T. et al.: "Electronic structures of p–type GaN codoped with Be or Mg as the acceptors and Si or O as the donor codopants" Journal of Crystal Growth, 1998, vol. 189–190, pp. 532–536, XP004148570, ISSN: 0022–0248.

S. Nakamura, T. Mukai, and M. Senoh, "Si– and Ge– Doped GaN Materials Grown with GaN Buffer Layers", Jpn. J. Appl. Phys. vol. 31, pp. 2883–2888, 1992.

X. Zhang, P. Kung, A. Saxler, D. Walker, T.C. Wang, and M. Razeghi, "Growth of $Al_xGa_{1-x}N$:Ge on sapphire and silicon substrates", Appl. Phys. Lett. 67, vol. 12, pp. 1745–1747, (1995).

* cited by examiner

SEMICONDUCTOR DEVICES WITH SELECTIVELY DOPED III-V NITRIDE LAYERS

TECHNICAL FIELD

The present invention relates generally to semiconductor devices and more particularly to doping III-V nitride light-emitting devices.

BACKGROUND ART

Silicon (Si) is the donor of choice for doping n-type III-V nitrides due to its favorable properties. In particular, during metal-organic chemical vapor deposition (MOCVD), Si atoms can be delivered to the growing crystal by flowing silane ($SiH_4$), which is available as a high purity grade gas. In addition, Si incorporates efficiently onto the gallium (Ga) sites in the gallium nitride (GaN) lattice where it acts as a donor. Further, Si in GaN (SiGa) is a shallow donor with an activation energy for ionization of ~20 meV.

However, with Si doping the achievable n-type conductivity of an III-V nitride layer is limited due to the fact that the incorporation of Si leads to the formation of cracks for heteroepitaxially-grown III-V nitride materials (particularly on sapphire substrates). For a given material thickness, the material cracks when the Si doping level exceeds a certain critical concentration. Likewise, for a given doping concentration, the material starts to crack when the material thickness exceeds a certain critical thickness.

Both a high doping concentration and a large material thickness are desirable to reduce the electrical resistivity of a semiconductor material. For example, for an ~3.5 $\mu$m thick GaN material, as typically employed in a light-emitting diode (LED) structure, the doping concentration is limited to ~5e18 $cm^{-3}$. As a consequence of the aforegoing, the series resistance of an aluminum indium gallium nitride (AlInGaN) LED is dominated by the resistance of the Si-doped GaN layer. This is the case for growth on non-conductive substrates such as sapphire where the current passes laterally through the Si-doped GaN layer as well as growth on conductive substrates such as silicon carbide (SiC) and hydride vapor phase epitaxy (HVPE) grown GaN where the current passes vertically through the thick Si-doped GaN layer. Higher doping concentrations and/or thicker n-type GaN materials (for growth on non-conductive substrates) would be advantageous for the fabrication of III-V nitride based LEDs with low series resistance.

Further, in addition to Si, germanium (Ge) and tin (Sn) have been studied as potential donor impurities for III-V nitride materials. However, there are reports on Ge doping experiments where it was concluded that doping with Ge is problematic. In the S. Nakamura, T. Mukai, and M. Senoh, *Si- and Ge-Doped GaN Materials Grown with GaN Buffer Layers*, Jpn. J. Appl. Phys. 31, 2883, 1992, it is reported that the doping efficiency of Ge is about one order of magnitude lower than for Si. Furthermore, they concluded that the maximum carrier concentration for Ge-doped GaN is limited to ~1×10$^{19}$ $cm^{-3}$ because at this doping level the surface of the Ge-doped GaN materials becomes rough and shows pits. X. Zhang, P. Kung, A. Saxler, D. Walker, T. C. Wang, and M. Razeghi, *Growth of $Al_xGa_{1-x}N$:Ge on sapphire and Si substrates*, Appl. Phys. Lett. 67, 1745 (1995), concluded the Ge-doped aluminum gallium nitride (AlGaN) materials have low electron mobilities and that Ge doping is not useful for growing low resistivity materials.

For a long time, a solution has been sought to the problem of material cracking which occurs with Si doping levels exceeding certain concentrations at certain critical thicknesses. Further, Si doping is known to cause the III-V nitride materials to embrittle, which further enhances the tendency of the material to crack, and a solution to this problem has long been sought. It has also been shown that there is a large piezoelectric effect due to the lattice mismatch between GaN and its alloys. For example, an indium gallium nitride (InGaN) layer grown between two GaN layers will have a high piezoelectric sheet charge associated with each interface.

DISCLOSURE OF THE INVENTION

The present invention provides a semiconductor device having n-type device layers of III-V nitride having donor dopants such as germanium (Ge), silicon (Si), tin (Sn), and/or oxygen (O) and/or p-type device layers of III-V nitride having acceptor dopants such as magnesium (Mg), beryllium (Be), zinc (Zn), and/or cadmium (Cd), either simultaneously or in a doping superlattice, to engineer strain, improve conductivity, and provide longer wavelength light emission.

The present invention further provides a semiconductor device using Ge either singularly or in combination, as a co-dopant, with Si and Sn as donor dopants either simultaneously or in a doping superlattice to engineer strain. Unlike Si, the Ge doping concentration can range from ~10$^{19}$ $cm^{-3}$ to ~10$^{20}$ $cm^{-3}$ at layer thicknesses of 3 $\mu$m and higher without causing cracking problems.

The present invention further provides donor impurities which do not cause embrittlement of III-V nitride materials.

The present invention further provides multi-donor impurity doping for III-V nitride materials to control doping and strain engineering separately.

The present invention further provides highly conductive, n-type, Ge-doped, gallium nitride (GaN) materials for utilization in contact layers of III-V nitride devices.

The present invention further provides a light-emitting device with donor impurities which promote growth of high indium nitride (InN) containing indium gallium nitride (InGaN) light emission layers for light emission at long wavelengths ($\lambda \geq 500$ nm). This allows the InGaN active region to contain a higher InN composition with higher quality and thus a higher efficiency, longer wavelength light emission or the growth of an AlGaN layer on top of GaN without cracking.

The present invention further provides a light-emitting device co-doped using a combination of Si, Ge, Sn, oxygen (O), magnesium (Mg), beryllium (Be), zinc (Zn), or cadmium (Cd) to improve the conductivity of III-V nitride materials which stabilize the structural integrity of heteroepitaxially-grown III-V nitride materials on lattice mismatched substrates.

The present invention further provides a light-emitting device using different donor dopants for conductive and contact layers.

The present invention further provides a light-emitting device where a bottom layer is doped with Ge and a layer on top doped with a different species (e.g. Si, Sn, or a combination of Si, Ge, and Sn). This permits adjustment of the in-plane lattice constant of GaN closer to the in-plane lattice constant of a ternary compound (e.g., InGaN or aluminum gallium nitride (AlGaN)). This allows the InGaN active region to contain a higher InN composition with higher quality and thus a higher efficiency, longer wavelength light emission or the growth of an AlGaN layer on top of GaN without cracking.

The present invention further provides a method of controlling strain and, thus, the effects of piezoelectricity in III–V nitride layers. Strain engineering plays a major role in controlling piezoelectric interface charges.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
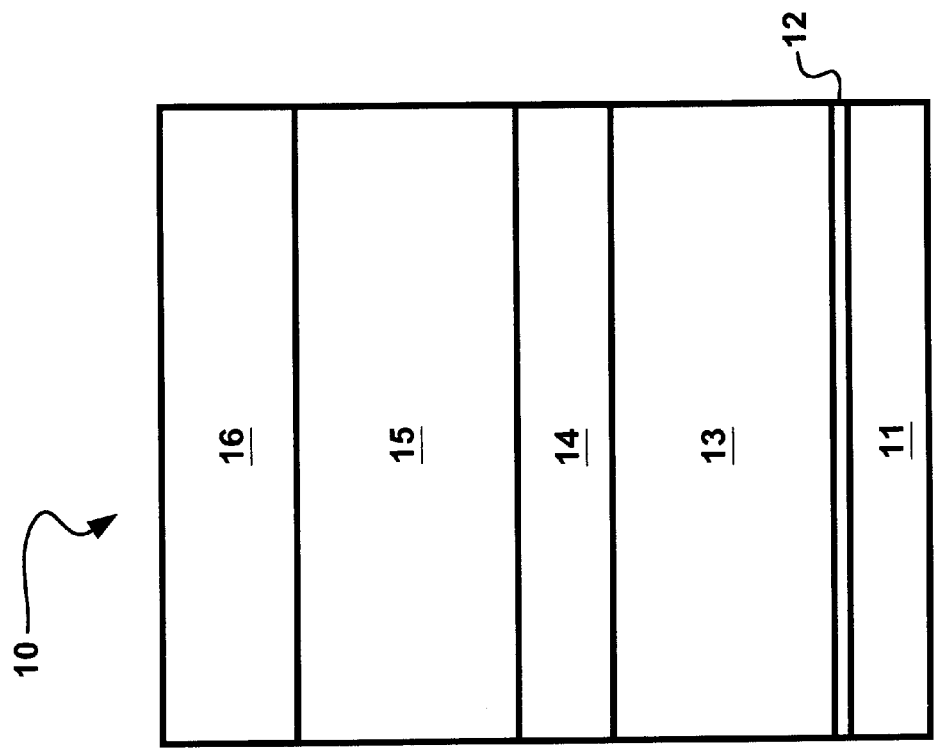
FIG. 1 is a light-emitting device incorporating the doped III–V nitride layer of the present invention.

Referring now to FIG. 1, therein is shown an electronic device such as a light-emitting device 10 which could be a light-emitting diode (LED) or laser diode (LD). The light-emitting device 10 includes an optional substrate 11 of sapphire, silicon carbide (SiC), silicon (Si), gallium arsenide (GaAs), or gallium nitride (GaN). It should be understood that the substrate 11 could be discarded in the formation of the light-emitting device 10 after deposition of the various layers which will hereinafter be described.

Due to difficulties in nucleation of the single crystalline III–V nitride layers on foreign substrates, a low temperature buffer layer 12 is often disposed on the substrate 11. The buffer layer 12 is of a material such as GaN or aluminum nitride (AlN) deposited on sapphire at low temperatures around 500° C.

A highly conductive, n-type, light-emitting, III–V nitride layer 13 is deposited on the buffer layer 12. The nitride layer 13 is made of a doped GaN, an indium gallium nitride (InGaN), an aluminum gallium nitride (AlGaN), an aluminum indium nitride (AlInN), or an aluminum gallium indium nitride (AlGaInN). These materials enable low driving voltages for the light-emitting device 10 due to reduced resistance in the n-layer, excellent electron injection due to high electron concentration near the p-n junction, and the formation of electrodes to the layers with the ohmic electrical characteristics. In the preferred embodiment, the dopant is germanium (Ge) instead of silicon (Si) or combinations of Si, Ge, tin (Sn), and oxygen (O).

An active layer 14 is deposited on the nitride layer 13. The active layer 14 can have a single-quantum well (SQW), multiple-quantum well (MQW), or double-hetero (DH) structure. Generally, this layer is GaN, AlGaN, AlInN, InGaN, or AlInGaN.

A highly conductive p-type, III–V nitride layer 15 is deposited on the active layer 14. The p-type nitride layer 15 is similar to the n-type nitride layer 13 except with a p-type dopant being used.

Final device layers 16, such as cladding and/or contact layers, may be deposited on top of the p-type nitride layer 15.

The various layers may be grown using techniques such as metal organic chemical vapor deposition (MOCVD), molecular beam epitaxy (MBE), gas source MBE (GSPMBE), or hydride vapor phase epitaxy (HVPE). Also, the composition and/or doping of the various layers may change abruptly from one layer to another, may be smoothly graded over a finite thickness, may be graded over the entire thickness of a layer, or may be combined with undoped layers.

Figure 2:
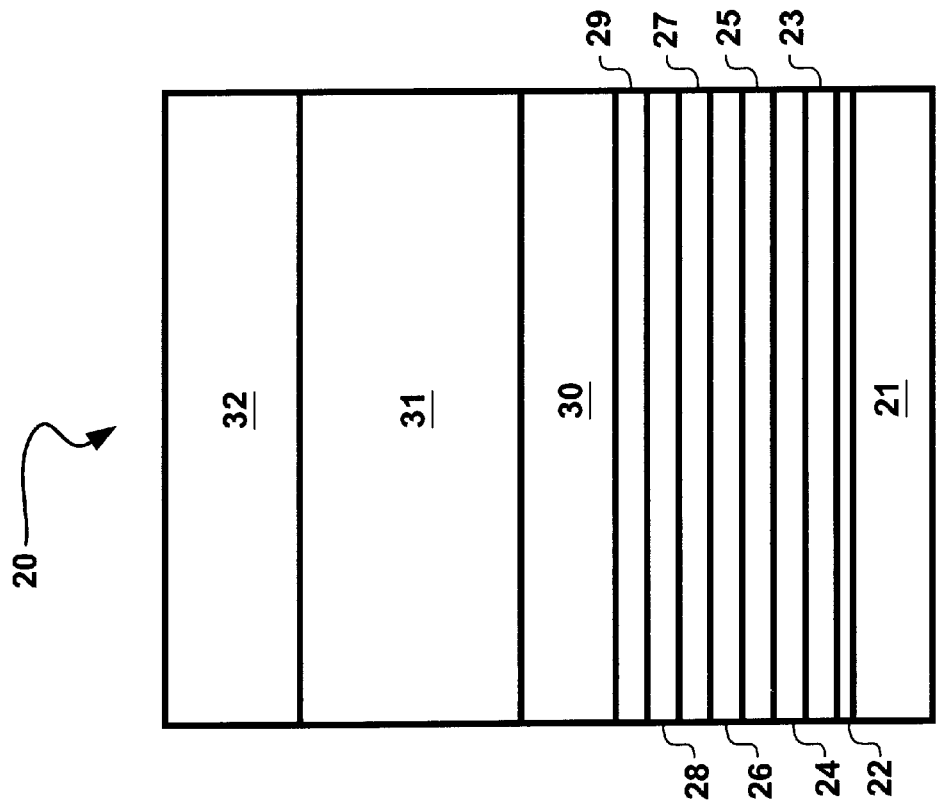
FIG. 2 is a light-emitting device having the doped superlattice of the present invention.

Referring now to FIG. 2, therein is shown an electronic device, such as a light-emitting device 20. The light-emitting device 20 includes an optional substrate 21 of sapphire, silicon carbide (SiC), silicon (Si), gallium arsenide (GaAs), or gallium nitride (GaN). Again, due to difficulties in nucleation of the single crystalline III–V nitride layers on foreign substrates, a low temperature buffer layer 22 is often disposed on the substrate 21. The buffer layer 22 is of a material such as GaN or AlN deposited on sapphire at low temperatures.

A highly conductive, n-type III–V nitride layer is deposited on the buffer layer 22. This nitride layer can be GaN with layers doped with different donors, GaN and InGaN layers doped with different donors, InGaN, AlGaN, and AlGaInN doped with different donors, or these layers with undoped layers in between. This layered structure may be termed a "superlattice", although the layers are thicker than those in a conventional superlattice structures since these layers should range from 10 Å (angstroms) to 10 μm (microns) in thickness. It has been determined that this greater thickness provides greater strain control.

The doped layers are designated as nitride layers 23 through 29, which have combinations of Si, Ge, Sn, and O as dopants. The combination of dopants is alternated such that the odd numbered doped nitride layers, designated as nitride layers 23, 25, 27, and 29, use one or more dopant(s) and the other nitride layers, the even numbered doped nitride layers, designated as nitride layers 24, 26, and 28, use another dopant or combination of dopants to achieve a desired state of strain. For example, the nitride layers 23, 25, 27, and 29 are Ge doped and the nitride layers 24, 26, and 28 are Si doped.

An active layer 30 is deposited on the nitride layer 29. The active layer 30 can have a SQW, MQW, or DH structure. Generally, this layer is an InN containing InGaN or AlInGaN. With a higher InN composition in the InGaN active region, a longer wavelength light emission can be obtained.

A highly conductive p-type, III–V nitride layer 31 is deposited on the active layer 30. The p-type nitride layer 31 is the same as the n-type nitride layer 23 except with a p-type dopant being used.

Final device layers 32, such as cladding and/or contact layers, may be deposited on top of the p-type nitride layer 31. The final device layers 32 are the other layers required by the light-emitting device 20.

Figure 3:
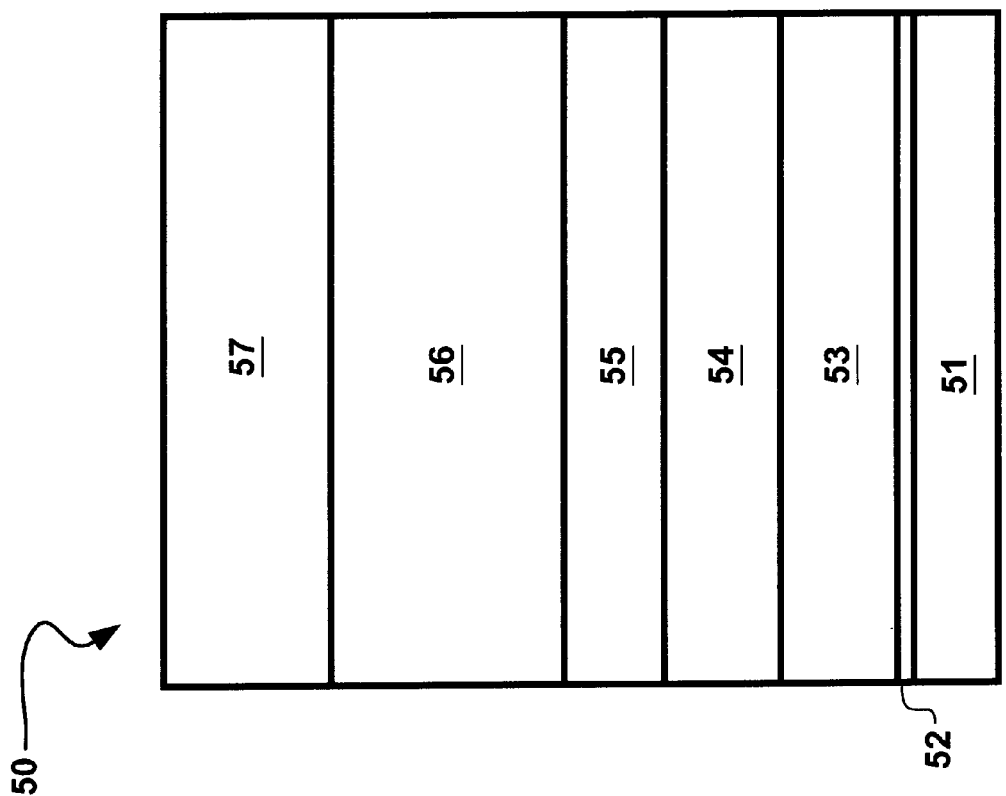
FIG. 3 is a light-emitting device incorporating the strain engineered doping of the present invention.

Referring now to FIG. 3, therein is shown another electronic device, such as a light-emitting device 50. The light-emitting device 50 includes a substrate 51 of sapphire, SiC or GaN. Due to difficulties in nucleation of the single crystalline III–V nitride layers on foreign substrates, a low temperature buffer layer 52 is often deposited on the substrate 51. The buffer layer 52 is of a material such as GaN or AlN.

A highly conductive, n-type III–V nitride layer is deposited on the buffer layer 52. This nitride layer is made of doped GaN, InGaN, AlGaN, AlInN, or AlGaInN. Here, one dopant species is used in a nitride layer designated as nitride layer 53 and a second in a nitride layer designated as nitride layer 54. In the preferred embodiment, the dopants are combinations of Si, Ge, Sn, and O. Where the nitride layer 53 is doped with Si and the nitride layer 54 with Ge, the nitride layer 54 can be a contact layer.

An active layer 55 is deposited on the nitride layers 53 and 54. The active layer 55 can have a SQW or MQW structure. Generally, this layer is an InN containing InGaN or AlInGaN.

A highly conductive p-type, III–V nitride layer 56 is deposited on the active layer 55. The p-type nitride layer 56 is similar to the n-type nitride layers 53 and 54 except with a p-type dopant being used.

Final device layers 57, such as cladding and/or contact layers, may be deposited on top of the p-type nitride layer 56. The final device layers 57 are the other layers required by the light-emitting device 50.

In the past, Si has been the donor of choice for doping n-type, III–V nitride layers due to its favorable properties. However, with Si doping the achievable n-type conductivity of an III–V nitride layer is limited due to the fact that the incorporation of Si leads to the formation of cracks in heteroepitaxially-grown GaN due to differences in lattice constants and in coefficients of thermal expansion with the substrate. It is possible that the cracking problem is a consequence of the small ionic radius of Si donors as compared to Ga host atoms. Si has an ionic radius of 0.41 Å while Ga has an ionic radius of 0.62 Å. For example, it has been determined that for growth on c-plane sapphire, Si doping leads to more compressive strain in the c-axis direction for high Si doping concentrations. As a consequence, the basal plane of GaN is put into more tensile strain. Two potential donor impurities, Ge and Sn for III–V nitride materials possess larger ionic radii than Si and are much closer to the ionic radius of Ga. Ge has an ionic radius of 0.53 Å and Sn has an ionic radius of 0.71 Å.

Further, like Si, both Ge and Sn doping sources are readily available as gases, germanium hydride ($GeH_4$) and tin hydride ($SnH_4$), for use with conventional MOCVD processes. And, the donor ionization energies of Ge in GaN ($Ge_{Ga}$) and Sn in GaN ($Sn_{Ga}$) are expected to be similar to that of silicon in GaN ($Si_{Ga}$). This makes these ions ideal dopants.

With reference to the structure shown in FIG. 1, the nitride layer 13 can be doped with Si, Ge, Sn, or O alone or together in combination. In contrast to Si-doped GaN, heavily Ge-doped GaN will not crack when grown thicker than ~1 μm. Further, the nitride layer 13 with Ge doping levels in the range from ~$10^{19}$ cm$^{-3}$ to ~$10^{20}$ cm$^{-3}$ typically form ohmic contacts with various metals, and thus make good contact layers. Ge doping at such concentration has been deemed to be unobtainable in the literature, as indicated by Nakamura et al, supra.

Also with reference to FIG. 1, the nitride layer 13 may be co-doped using a combination of the following donors: Si, Ge, Sn, and O. The different donor species are introduced simultaneously to stabilize the structural integrity of heteroepitaxially-grown III–V nitride on lattice mismatched substrates. For example, tensile strain can be reduced by using combinations of Si and Ge, Si and Sn, and Ge and Sn. In addition, the use of O is highly desirable as it will occupy the N-lattice site. Hence, there is no site competition with Si, Ge, or Sn which occupies the Ga lattice site, and higher doping levels may be achieved. With higher doping levels, it is possible to achieve much higher conductivity. Using co-dopants of Si/Ge, Si/Sn, and Ge/Sn, it is possible to stabilize the lattice and avoid cracking. The dopants and their percentages are chosen differently for the growth of GaN, InGaN, and AlGaN to adjust the strain state that is desirable for overgrowth of GaN, AlGaN, AlInN, InGaN, or AlInGaN.

With reference to FIG. 2, the light-emitting device 20 is a solution to the problem reported by Nakamura, et al., supra, that the doping efficiency for Ge is an order of magnitude lower than for Si. To circumvent this problem, Si layers could be sandwiched between Ge-doped layers so that the total thickness of the Si-doped layers does not exceed the critical thickness for cracking at the given doping level. Thus, the Si-doped layers 24, 26, and 28 would be relatively thin. The Ge-doped layers 23, 25, 27, and 29 can be doped to the same concentration, but can be made thick enough to provide the desired high conductivity.

Referring back to FIG. 1, the different dopants in the nitride layer 13 can be at a single dopant concentration or one which gradually changes from the buffer layer 12 to the nitride layer 13. It is also practical for the nitride layer 13 to start with one dopant at the buffer layer 12 and gradually decrease the concentration of the one dopant and gradually increase the concentration of the second dopant.

For example, a gradual adjustment of the strain for subsequent overgrowth of an InGaN or AlGaN active layer 14 will be possible by choosing a specific combination of dopants and grading their relative concentration. The in-plane lattice parameters for InGaN and AlGaN are larger and smaller, respectively, than the lattice parameters for GaN.

As a consequence, co-doping of a GaN nitride layer 13 with two different donor species and increasing the concentration of the donor species that increases the in-plane lattice constant towards the interface with an InGaN active layer 14 will adjust the lattice for overgrowth of InGaN. For example, co-doping with Si and Ge, and increasing Si concentration towards the InGaN interface.

On the other hand, choosing an alternative pair of donor dopants for a GaN nitride layer 13 and increasing the concentration of the donor that decreases the in-plane lattice constant towards the interface with an AlGaN active layer 14 will be advantageous for overgrowth of thick AlGaN layers as required for growth of mirror stacks in surface emitting lasers, for example, co-doping with Si and Ge, and increasing Ge concentration towards the AlGaN interface.

With reference now to FIG. 3, similar results to those just described above can be achieved by the introduction of a separately doped layer. For example, the nitride layer 53 of GaN could be doped with Ge. This would allow for high doping and the layer could also be thick. On top of the Ge-doped GaN layer, a heavily doped nitride layer 54 is grown using a different donor species such as Si which increases the lattice parameter in the c-plane and therefore will allow InGaN with high InN compositions to grow. With a higher InN composition in the InGaN active region, a longer wavelength light emission can be obtained. Also, higher tensile strain in the basal plane will reduce the piezoelectric sheet charge at the InGaN interface.

Alternately, the nitride layer 53 would contain GaN:Si and the nitride layer 54 of Ge-doped GaN would be grown on top with a Ge doping concentration of ~$10^{20}$ cm$^{-3}$. This high Ge-doped nitride layer 54 would be a contact layer which is thick enough so that it can be easily reached by etching even if the etch depth varies. The active layer 55 is then grown on top of this contact layer.

While the invention has been described in conjunction with a specific best mode, it is to be understood that many alternatives, modifications, and variations will be apparent to those skilled in the art in light of the aforegoing description. For example, the structure is further applicable to highly doped p-layers in semiconductor devices where the dopants would be Mg, Be, Zn, or Cd. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A light emitting device comprising:
   a substrate;
   a buffer layer overlying said substrate, said buffer layer deposited at temperature about 500 C.;
   an n-doped III–V first contact nitride layer overlying said substrate and doped with a first dopant;
   an n-doped III–V stress reducing conductive second nitride layer overlying said first contact nitride layer and doped with a second dopant, said second dopant being different from said first dopant, said first dopant, said first dopant and said second dopant being selected from the group consisting of silicon, germanium, tin, or a combination thereof, and having a concentration between $10^{19}$ cm$^{-3}$ and $10^{20}$ cm$^{-3}$ in one of said first and second nitride layers, said second nitride layer having a thickness between 100 nanometers and 10,000 nanometers
   an active layer overlying said second nitride layer; and
   a p-doped III–V third nitride layer overlying said active layer, doped with at least one element selected from the group consisting of magnesium, beryllium, zinc, and cadmium.

2. The light emitting device of claim 1, further comprising:
   a first plurality of nitride layers, including said first nitride layer, doped with said first dopant; and
   a second plurality of nitride layers, including said second nitride layer, doped with said second dopant, wherein said first and second pluralities of nitride layers are positioned in an alternating manner.

3. The light emitting device of claim 2 wherein:
   said first dopant is silicon; and
   said second dopant is germanium.

4. The light emitting device of claim 3, wherein:
   the concentration of said germanium in said second nitride layers is between $10^{17}$ cm$^{-3}$ and $10^{20}$ cm$^{-3}$.

5. The light emitting device of claim 2, further comprising:
   at least one undoped layer positioned between a nitride layer of said first plurality of nitride layers and nitride layer of said second plurality of nitride layers.

6. The light emitting device of claim 2, wherein at least one nitride layer of said first plurality of nitride layers and said second plurality of nitride layers is doped with oxygen.

7. The light emitting device of claim 2 wherein:
   at least one of said first dopant's concentration in at least one nitride layer of said first plurality of nitride layers and said second dopant's concentration in at least one nitride layer of said second plurality of nitride layers substantially changes with the distance from said active layer.

8. The light emitting device of claim 2, wherein:
   the thickness of each layer of said first and second nitride layers is between 1 nanometers and 10,000 nanometers.

9. A light emitting device, comprising:
   a substrate;
   a buffer layer overlying said substrate, said buffer layer deposited at temperatures about 500 C.;
   an n-doped III–V first stress reducing conductive nitride layer overlying said substrate and doped with a dopant, said dopant selected from the group consisting of silicon, germanium, tin, and a combination thereof, wherein
   the concentration of said dopant changes with the distance from said substrate between $10^{19}$ cm$^{-3}$ and $10^{20}$ cm$^{-3}$; and
   the thickness of said first nitride layer is between 100 nanometers and 10,000 nonometers;
   an active layer positioned over said n-doped III–V first nitride layer; and
   a p-doped III–V second nitride layer overlying said active layer, doped with at least one element selected from the group consisting of magnesium, beryllium, zinc, and cadmium, wherein the in-plane lattice constant of said first nitride layer is substantially matched with the lattice constant of one of said active layer and said second nitride layer.

10. The light emitting device of claim 1, wherein said first nitride layer is positioned directly in contact with said substrate.

11. The light emitting device of claim 1, wherein said second nitride layer is positioned directly in contact with said first nitride layer.

12. The light emitting device of claim 1, wherein said active layer is positioned directly in contact with said second nitride layer.

13. The light emitting device of claim 1, wherein said third nitride layer is positioned directly in contact with said active layer.

* * * * *